(12) United States Patent
Best et al.

(10) Patent No.: US 7,695,667 B2
(45) Date of Patent: Apr. 13, 2010

(54) METHOD AND APPARATUS FOR SEPARATING A STAMPER FROM A PATTERNED SUBSTRATE

(75) Inventors: Margaret Evans Best, San Jose, CA (US); Tsai-Wei Wu, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 796 days.

(21) Appl. No.: 11/365,021

(22) Filed: Mar. 1, 2006

(65) Prior Publication Data

US 2007/0205524 A1    Sep. 6, 2007

(51) Int. Cl.
   *B28B 7/12*   (2006.01)
(52) U.S. Cl. .................. 264/335; 425/358; 425/193; 425/110
(58) Field of Classification Search ............... 264/335; 425/358, 193, 110
   See application file for complete search history.

(56) References Cited

U.S. PATENT DOCUMENTS

| | | | | |
|---|---|---|---|---|
| 3,485,908 A * | 12/1969 | Burger | .................. | 264/102 |
| 4,907,956 A * | 3/1990 | Ezaki et al. | .................. | 425/110 |
| 6,469,848 B1 | 10/2002 | Hamada et al. | .................. | 360/17 |
| 6,478,069 B1 | 11/2002 | Fujisaku et al. | .................. | 156/584 |
| 6,762,892 B2 * | 7/2004 | Hamada et al. | .................. | 360/17 |
| 6,858,329 B2 | 2/2005 | Hamada et al. | .................. | 428/694 |
| 2003/0002182 A1 | 1/2003 | Kamatani et al. | .................. | 360/17 |
| 2004/0021254 A1 | 2/2004 | Sreenivasan et al. | .................. | 264/406 |
| 2005/0082700 A1 * | 4/2005 | Deeman et al. | .................. | 264/2.5 |
| 2005/0184436 A1 * | 8/2005 | Jeong et al. | .................. | 264/496 |
| 2005/0270674 A1 * | 12/2005 | Wago et al. | .................. | 360/17 |

FOREIGN PATENT DOCUMENTS

| | | |
|---|---|---|
| EP | 0 440215 | 1/1991 |
| EP | 1187109 | 9/2001 |
| JP | 60-122140 | 12/1983 |
| JP | 2047011 | 2/1990 |
| JP | 2001-351235 | 6/2000 |
| JP | 2000357321 | 12/2000 |
| JP | 2001093198 | 4/2001 |
| JP | 2004-079027 | 8/2002 |
| JP | 2003272258 | 9/2003 |
| JP | 2004280907 | 10/2004 |
| WO | WO03/090985 | 11/2003 |

* cited by examiner

*Primary Examiner*—Eric Hug
*Assistant Examiner*—Jacob Thomas Minskey
(74) *Attorney, Agent, or Firm*—Kunzler Needham Massey & Thorpe

(57) ABSTRACT

A method and apparatus are disclosed for separating a stamper from a patterned substrate. The method includes providing a substrate having a top and a bottom with an opening therein, providing a support mechanism configured to retain the substrate, providing a stamper having a formed pattern and configured to come in contact with the top of the substrate, wherein a chamber is formed within the opening of the substrate when the stamper is in contact with the substrate, providing a channel directed toward the chamber to introduce pressurized air into the chamber, and directing pressured air through the channel to the chamber to initiate separation of the stamper from the substrate. In certain embodiments, the pressurized air may be directed toward an opening in the substrate, such as a central ID hole in a disk. The disk may be incorporated within a storage device as pattered magnetic media.

24 Claims, 6 Drawing Sheets

METHOD AND APPARATUS FOR SEPARATING A STAMPER FROM A PATTERNED SUBSTRATE

BACKGROUND OF THE INVENTION

1. Field of the Invention

This invention relates to a method and apparatus for patterning a substrate and more particularly relates to a method and apparatus for separating a stamper from a patterned substrate.

2. Description of the Related Art

Nanoimprint technology has developed rapidly in the past decade and offers promising advancements with regards to the replication of nanometer-scaled structures. The technological improvements have been a boon to several growing industries including integrated circuits (IC), micro electro mechanical systems (MEMS), and magnetic storage mediums. Replicating minute structures, however, introduces several problems that must be surmounted in order to refine the imprinting process. Forces such as friction and adhesion, for example, must be overcome in order to achieve optimal results. In addition, inexpensive mechanisms and simplistic methods are needed to advance the imprinting process and to make the process more cost effective.

Imprint (or "nanoimprint") lithography has been proposed as an effective method to generate patterned magnetic media for use in storage devices. Imprint lithography is a method of lithography that uses a mold (stamper) or a mechanical force to pattern a resist. In certain embodiments, a formed pattern is created on a surface of the stamper using electron beam (e-beam) lithography, enabling the formation of high resolution features on the stamper. E-beam lithography is a relatively expensive and prolonged process, however, often requiring months to complete a pattern. The finished stamper, though, may be used repeatedly in a relatively inexpensive process to transfer the e-beam formed pattern onto a substrate surface.

FIGS. 1A-1F depict a series of cross-sectional views illustrating a substrate 100 subjected to a prior art imprint lithography process to create nano-scaled features, such as pillars 108 for creating data recording bits. The substrate 100 includes a resist layer 102 (FIG. 1A). The resist layer 102 is shaped by a stamper 104 and cured to create pillars 106 in the resist (FIG. 1B-1C). The resist layer 102 functions as a mask (FIG. 1D) to resist ions 114 during a reactive ion etching (RIE) process. Pillars 108 are etched into the substrate 100 (FIG. 1E). A magnetic layer 110 is subsequently deposited over the pillars 108 (FIG. 1F) to provide magnetic islands for data recording bits, thereby forming the foundation for patterned magnetic media.

Imprint lithography processes generally require that the resist be cured either by ultra violet (UV) light or by thermal energy. In thermal imprinting, the stamper 104, the sample substrate 100, or both are heated to soften the resist 102 during the imprinting process. Upon cooling, the imprinted resist patterns or features 106 solidify, retaining the imprinted shape after removal of the stamper 104.

In UV-cure imprinting, a transparent stamper 104 is pressed against a substrate 100 coated with a liquid photopolymer resist 102. After exposure to UV light 112 (FIG. 1B), photo initiators in the resist cause the resist 102 to polymerize into a solid, leaving solidified topographic features 106 in the cured resist layer 102 (FIG. 1C). Pressure may be applied to the stamper 104 and/or substrate 100 during the curing process to ensure complete formation of quality features 106 in the resist 102.

In the depicted embodiment, the stamper 104 comprises minute holes 116, which may be patterned to correspond to data recording bits of patterned magnetic media. Patterned media can provide increased bit density and storage capacity with greater thermal stability than conventional multigrain magnetic media. Patterned media can be formed by a variety of methods known to those skilled in the art in addition to the depicted imprint lithography process.

To form patterned media, a highly ordered array of pillars 108, or magnetic islands, is typically formed on the substrate 100 surface. High density is achieved by storing data in tracks just one island wide, rather than tracks wide enough to accommodate multiple (typically on the order of 10) random grains. In one embodiment, the pillars 108 or holes 116 are approximately 20 nm in diameter. Viable data storage densities of around one terabits per square inch may be achievable with patterned media.

Once the features 106 in the resist layer 102 are formed, the stamper 104 must be separated and removed from the substrate 100. Because the holes 116 in the stamper 104 increase the effective surface area of the stamper 104, the surface energy generally causes the stamper 104 to stick to the resist layer 102, requiring a substantial force to decouple the stamper 104 from the substrate 100. Typically, a pin, hook, wedge, or other mechanical device may be used to force the separation.

Directly lifting the stamper 104 requires a large force to achieve separation that may cause mechanical damage to the imprinted features. Direct contact with the substrate 100 surface and/or the stamper 104 surface is generally undesirable because contact can also damage the miniscule features and impair any potential functions, such as data throughput, for example. Furthermore, using a chisel or wedge to propagate a Mode 1 crack from the outside diameter of a disk or the like may reduce the amount of force required for separation, but can also introduce unbalanced forces causing non-uniform separation. To initiate a uniform separation, multiple wedges functioning simultaneously, mechanical tilting, or other mechanical feats that are difficult to achieve may be required.

From the foregoing discussion, it should be apparent that a need exists for a method and apparatus that facilitate separation of the stamper from the substrate. Beneficially, such an apparatus and method would provide a simple force to uniformly separate the stamper from the substrate without causing harm to either the substrate or the imprinted features. In addition, the method and apparatus would be inexpensive, easy to implement and executable in a minimal amount of time.

SUMMARY OF THE INVENTION

The present invention has been developed in response to the present state of the art, and in particular, in response to the problems and needs in the art that have not yet been fully solved by currently available methods and apparatuses for separating a stamper from a substrate. Accordingly, the present invention has been developed to provide an apparatus and method for separating a stamper from a substrate that overcome many or all of the above-discussed shortcomings in the art.

The apparatus, in one embodiment, is configured to provide a source of pressurized air to initiate separation of a stamper from a substrate. The apparatus may include a substrate having a top and a bottom with an opening therein, a support mechanism to retain the substrate, a stamper having a formed pattern and configured to come in contact with the top of the substrate, a chamber formed within the opening of the substrate when the stamper is in contact with the substrate, a channel directed toward the chamber, and a source of pressurized air directed through the channel to the chamber.

The pressurized air may provide a force sufficient to separate the stamper from the substrate. In addition, the air may replace the void created between the stamper and the substrate, thereby enabling propagation of the resulting crack quickly and without much resistance. Furthermore, separation may be achieved without using an additional mechanical device such as a pin, hook, wedge, or the like to initiate or propagate the separation. Using pressurized air simplifies the separation process, is cost effective, and prevents damage to the stamper, to the substrate, and/or to delicate surface features.

The apparatus is further configured, in one embodiment, to provide a vacuum chuck to retain the substrate with suction force. In one embodiment, the channel is directed through the vacuum chuck toward the formed chamber within the substrate opening. The vacuum chuck may provide a flat retaining surface without the use of clamps or the like, which beneficially prevents substrate distortion. In certain embodiments, the suction force required to retain the substrate may be greater than the force exerted by the pressurized air.

In a further embodiment, the substrate comprises a disk with an inside diameter (ID) and an outside diameter (OD). The chamber may be formed within the central ID hole of the disk. The patterned disk may further be incorporated within a storage device as patterned magnetic media. The stamper, in certain embodiments, comprises a formed pattern having nano-scaled features corresponding to data recording bits.

A method of the present invention is also presented for separating a stamper from a patterned substrate. In one embodiment, the method includes providing a substrate having a top and a bottom with an opening therein, providing a support mechanism configured to retain the substrate, providing a stamper having a formed pattern and configured to come in contact with the top of the substrate, wherein a chamber is formed within the opening of the substrate when the stamper is in contact with the substrate, providing a channel directed toward the chamber to introduce pressurized air into the chamber, and directing pressured air through the channel to the chamber to initiate separation of the stamper from the substrate.

In a further embodiment, the method includes facilitating the separation process by treating the stamper with a release treatment. Alternatively or in addition, the substrate, or an imprintable resist layer of the substrate, may be self-releasing to facilitate separation. One or more stamper release treatments and/or self-releasing resists or agents may be used individually or in combination to ensure a complete, rapid separation of the con stamper from the substrate. In one embodiment, the resist layer comprises an adhesion promoter to increase the stickiness between the resist layer and a surface layer of the substrate. In a contemplated embodiment, the cured resist layer adheres to the substrate and releases easily from the stamper to promote separation.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

The present invention enables separation of the stamper and the substrate using a force exerted by pressurized air. In certain embodiments, the pressurized air may be directed toward an opening in the substrate, such as a central ID hole in a disk. These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are disclosed to provide a thorough understanding of embodiments of the present invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 2A:
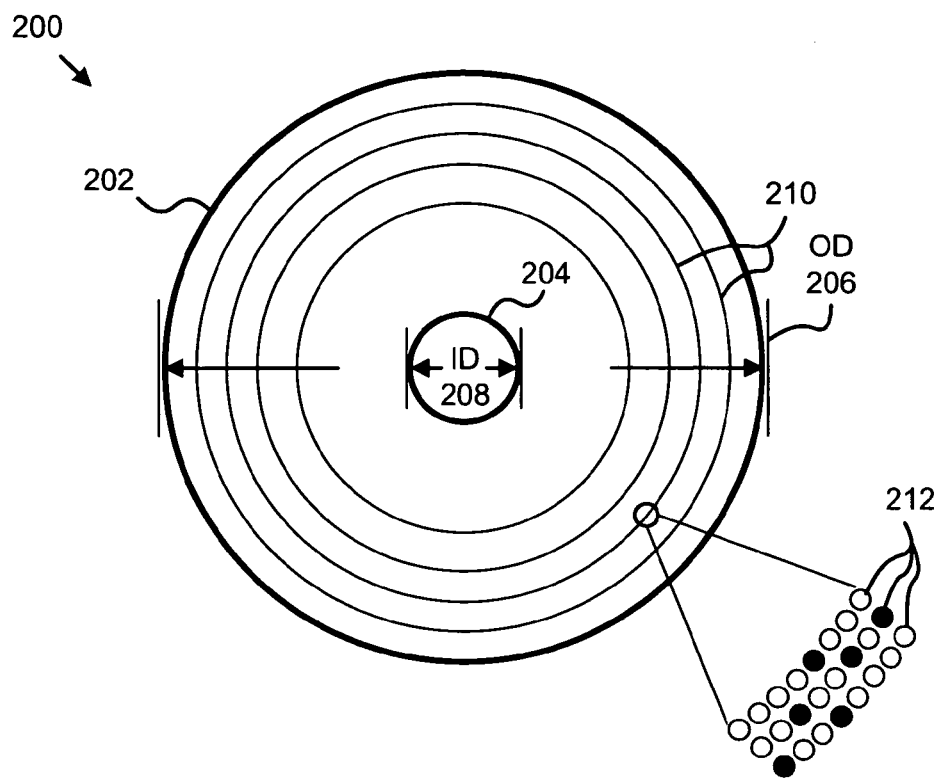
FIG. 2A illustrates a plan view of a disk having tracks and patterned data recording bits.
Figure 3:
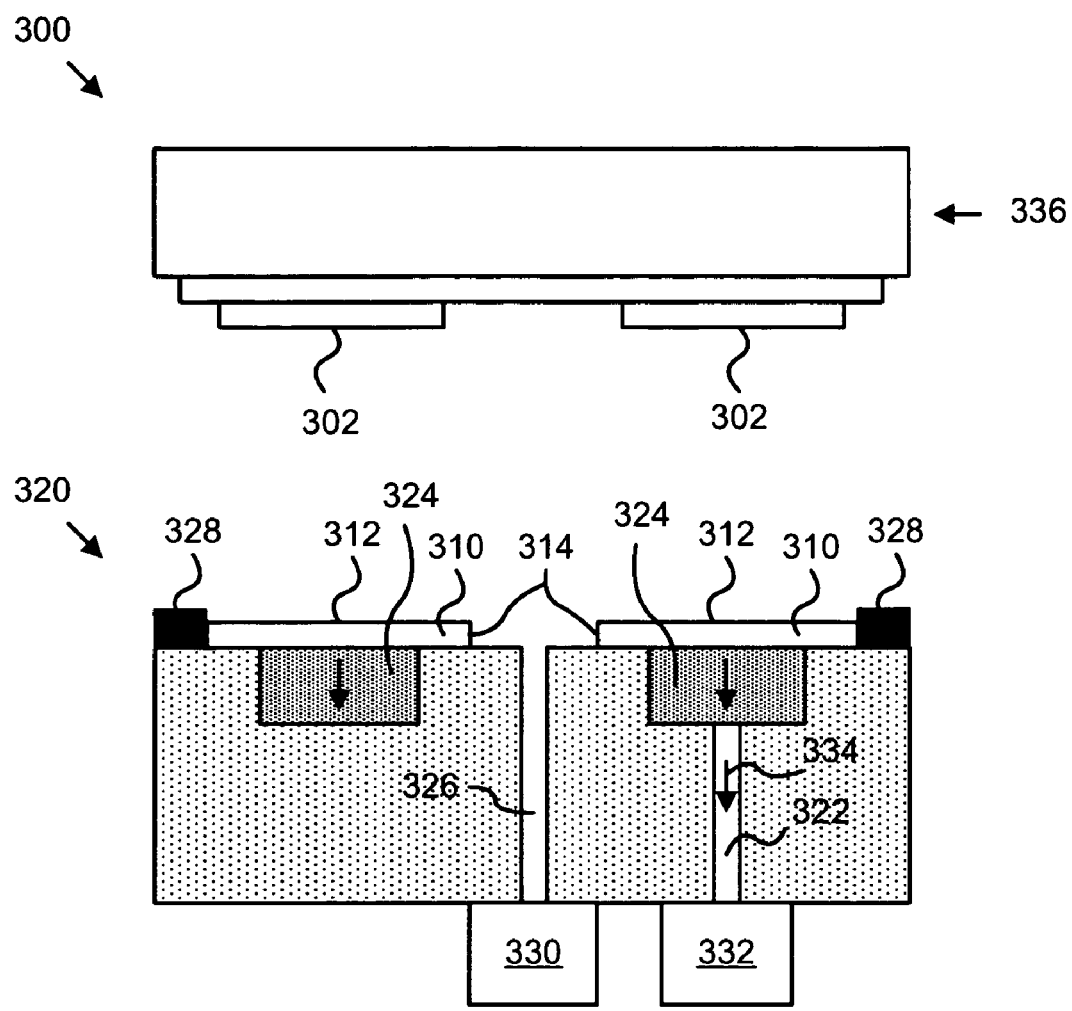
FIG. 3 illustrates a cross-sectional view of one embodiment of a stamper, a substrate, and a vacuum chuck in accordance with the present invention.
Figure 4:
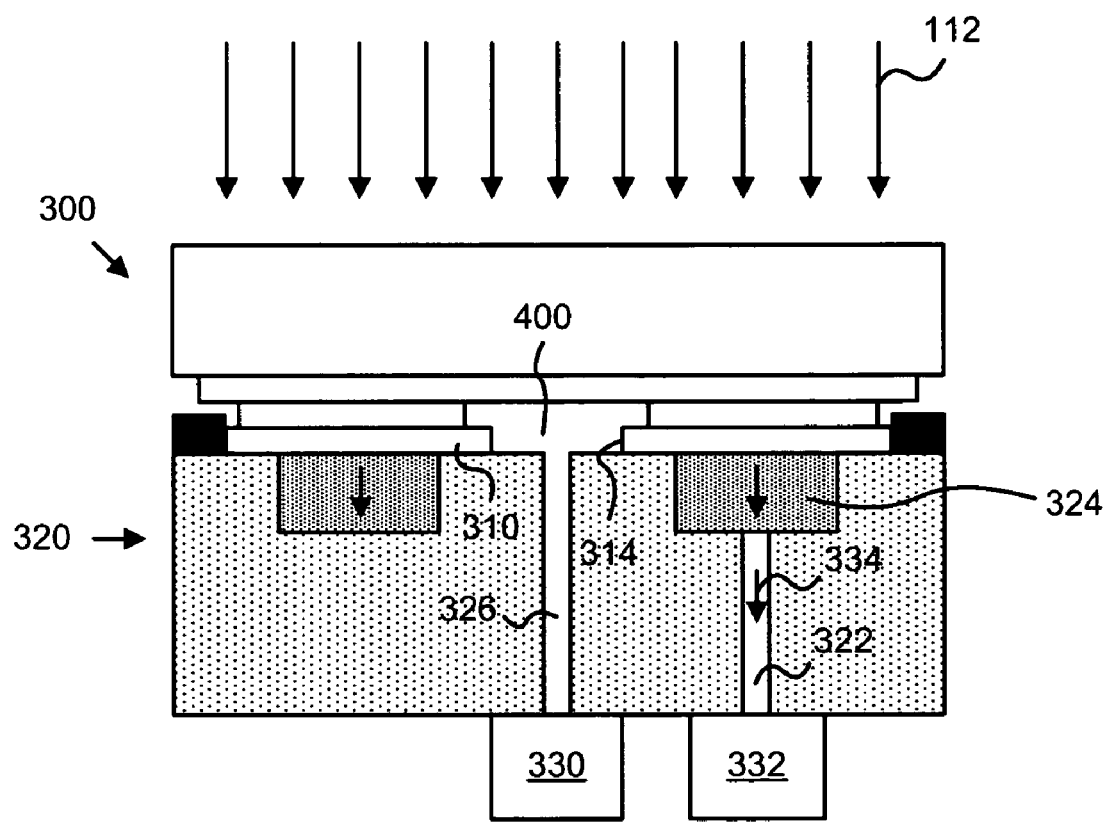
FIG. 4 illustrates a cross-sectional view of one embodiment of a stamper, a substrate, and a vacuum chuck during resist polymerization in accordance with the present invention.
Figure 5:
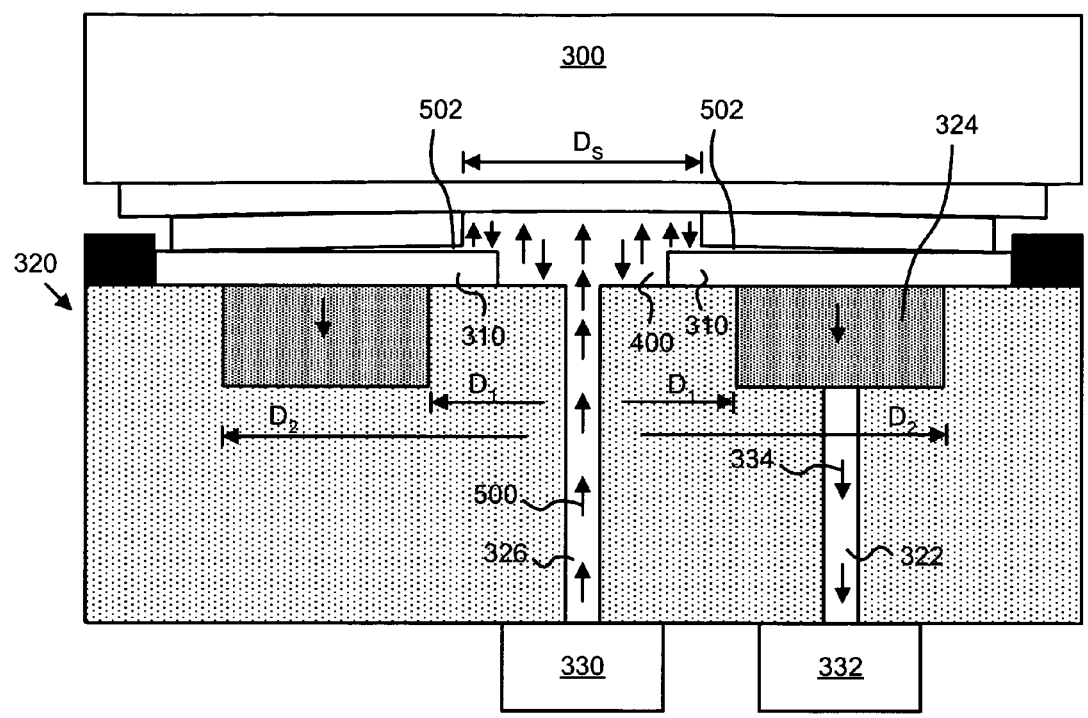
FIG. 5 illustrates a cross-sectional view of one embodiment of a stamper being separated from a substrate with pressurized air in accordance with the present invention.

FIG. 2A illustrates a plan view of a disk 200 containing patterned magnetic media formed using imprint technology as is known in the art. The disk 200 includes a circular outside edge 202, a central opening 204, an outside diameter (OD) 206, an inside diameter (ID) 208, tracks 210, and data recording bits 212. The central opening 204 may form part of a chamber, in certain embodiments, which may be beneficial in separating a stamper from a substrate using pressurized air as illustrated in FIGS. 3-5.

Figures 1A, 1B:
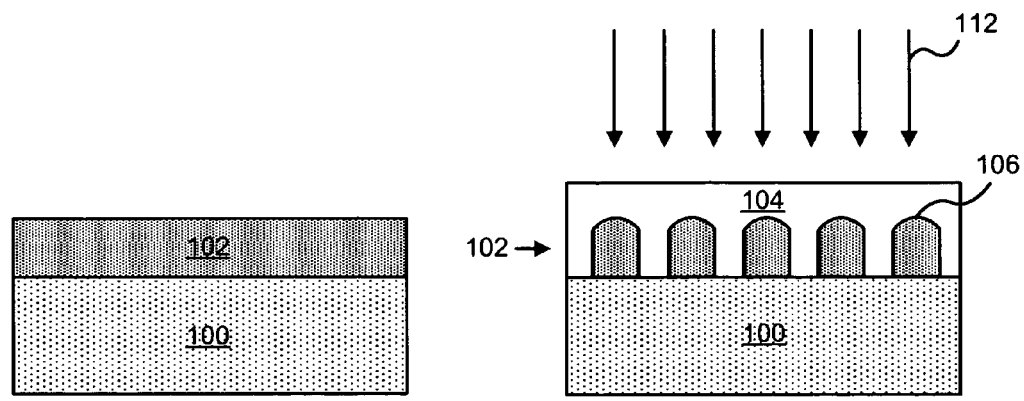
FIGS. 1A-1F are a set of cross-sectional views of a substrate illustrating a prior art lithographic imprint process used to create patterned magnetic media.
Figures 1C, 1D:
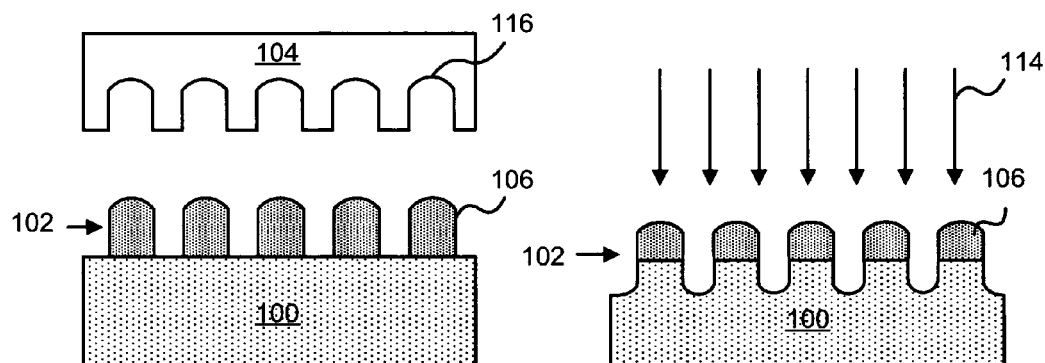
Figures 1E, 1F:
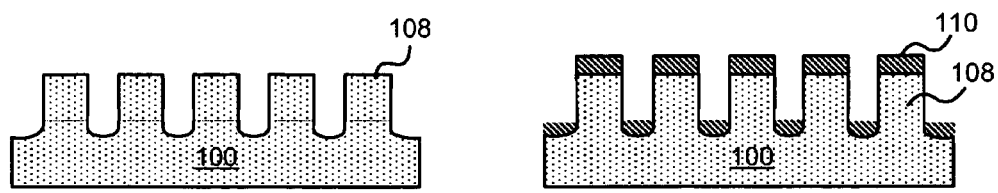

Each track 210, which is a ring on the disk 200 where data can be written, is used to identify where information is stored. A track 210 of patterned magnetic media generally comprises a number of highly uniform pillars 108 or islands as illustrated in FIG. 1F. Each island is capable of storing an individual data recording bit 212 that corresponds to a binary digit.

Disks 200 may be coated with a special thin film media designed to store information in the form of magnetic patterns. Electromagnetic read/write heads suspended or floating only fractions of micro inches above the disk 200 are used to either record information onto the thin film media or read information from it. In certain embodiments, the read/write head flies just a nanometer above the surface of the disk 200. Consequently, precision and substrate integrity are essential to achieve quality data throughput.

A read/write head may write information to the disk 200 by creating an electromagnetic field to orient a bit 212, or an isolated magnetic island 108, in one direction or the other. To read information, magnetic patterns detected by the read/write head are converted into a series of pulses which are sent to the logic circuits to be converted to binary data and processed by the rest of the system. To increase the capacity of storage media, manufacturers are continually striving to reduce the size of bits 212 and the magnetic grains that comprise the bits 212.

Patterned media with isolated islands 108 enables the bit size to be reduced without causing instability known as the superparamagnetic effect. In conventional multigrain magnetic media, for example, bits 212 are generally created by covering a flat substrate with a thin layer of magnetic alloy, which comprises formed clusters of atoms on the substrate surface known as grains. Each grain operates as a partially independent unit of magnetization subject to influence from other grains. Data stored in tracks 210 is comprised of regions of alternating magnetic polarity.

Due to their physical separation and reduced magnetic coupling to one another, the magnetic islands 108 function as individual magnetic units, comprised either of single grains or a collection of strongly-coupled grains within each island. Since these magnetic islands 108 are typically larger than the individual grains in conventional media, their magnetization is thermally stable.

To increase data storage density, tracks 210 may be made narrower, or the length of the regions of alternating polarity along the track 210 may be reduced. Shrinking these dimensions generally requires that the size of the random grains in the media be reduced, so that sharp boundaries and sharp track edge boundaries can be defined by the magnetic write head. If grains are too large, the signal to noise ratio of the recording system suffers, and data errors are generated at an unacceptable rate. On the other hand, if the grains are too small, they may become unstable from thermally induced vibrations and spontaneously reverse their magnetic polarity (leading to loss of stored data). As a result of the superparamagnetic effect, the areal density of stable storage media has typically been restricted to around 150 Gbit/in$^2$ for conventional multigrain magnetic recording media.

Forming individual pillars 108 on the substrate of the disk 200 increases the storage capacity and reduces the risk of losing data due to magnetic grain instability. The benefits of creating patterned magnetic media and storage devices incorporating patterned magnetic media, such as hard disk drives (HDD), have been widely demonstrated.

Figure 2B:
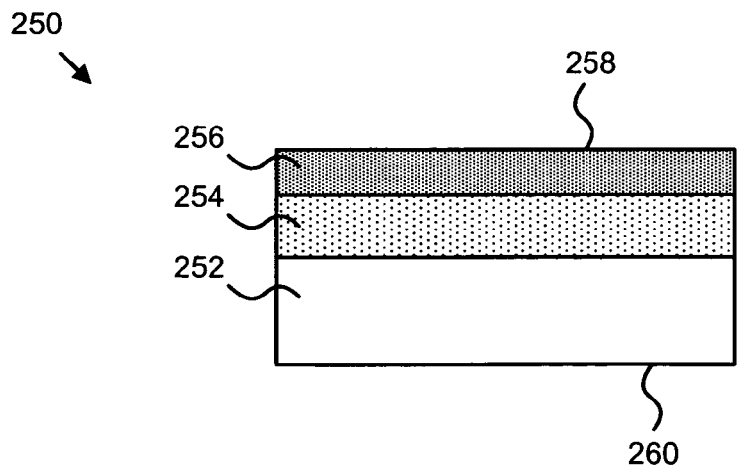
FIG. 2B illustrates a cross-sectional view of a substrate with a surface layer selected to undergo a feature etching process and an imprintable resist layer.

FIG. 2B illustrates one embodiment of a cross-section of a substrate 250. The substrate 250 may be a disk 200 with an opening 204 in certain embodiments and may include a base layer 252, a surface layer 254, an imprintable resist layer 256, a top 258, and a bottom 260. The thickness of the substrate 250 may vary according to the diameter 206 of the disk 200. Those of skill in the art will recognize, however, that substrates 250 suitable for subjection to an imprinting process are not necessarily limited to disks 200. In addition, a substrate 250 may comprise multiple layers selected for various reasons and qualities, and is not, therefore, limited to the illustrated embodiment.

The base layer 252 may be made of a solid material, such as glass or metal. A commonly used metal may comprise an alloy of aluminum and magnesium. The base layer 252 may comprise the bottom 260 of the substrate 250 in certain embodiments. Alternatively, the bottom 260 may be coated or layered as well. For clarification purposes, the top 258 of the substrate 250 as used herein refers to the side of the substrate 250 selected and prepared to undergo an imprinting process.

The surface layer 254 may be selected to undergo a feature etching process as is known in the art. In certain embodiments, the surface layer 254, which may be about forty nanometers thick, is a layer of silicon nitrite coated on the base layer 252. In the case of a disk 200 or magnetic media having formed pillars 108 corresponding to data recording bits 212, the surface layer 254 may be etched to form the pillars 108 that receive the layer of magnetic coating 110 as illustrated in FIG. 1F.

To etch the surface layer 254, the surface layer 254 and the molded imprintable layer 256 may be exposed to ions 114 (FIG. 1D) during a directional etch process such as Reactive Ion Etching (RIE). The ions 114 combine with the material of the imprintable resist layer 256 and the surface layer 254 and may form an uncharged gas which is pumped out of the etching chamber, leaving an etched pattern in the surface layer 254. The imprintable resist layer 256 may etch at a rate usually lower than that of the surface layer 254, resulting in the formation of pillars 108 in the surface layer 254 if the patterns are etched deeply into the surface layer 254.

The imprintable resist layer 256 may comprise any resist capable of undergoing an imprinting process. A photo resist, as is known in the art, generally comprises a photo initiator curable in ultra violet (UV) light. Alternatively, a resist may be cured by heat. In a contemplated embodiment, the imprintable resist 256 has a low viscosity, is UV-curable, and is resistant to reactive ion etching. Those of skill in the art will recognize that a suitable resist may comprise a variety of components and/or additives. Resist materials have been developed that are capable of replicating highly defined patterns.

In one embodiment, an adhesion promoter may be used to ensure adhesion of the imprintable resist layer 256 to the surface layer 256 and/or to the substrate 250. An adhesion promoter may be significant in order to preserve the integrity of the stamper 104 and the imprinted features. Even a small portion of the resist sticking to the stamper 104 may be detrimental to the stamper 104 and may spoil the patterned structures. Alternatively or in addition, the resist 256 may be self-releasing. In a contemplated embodiment, the imprintable resist layer 256 adheres to the substrate 250 and releases from the stamper 104. Those of skill in the art will recognize that one or more release treatments, agents, and/or resists with self-releasing qualities may be used individually or in combination to ensure a complete, rapid separation. In addition, other agents such as adhesion promoters and the like may also be used to achieve a desired result, such as easy separation. The scope of the invention, therefore, is not limited by the illustrated embodiments.

The imprintable layer 256 may function as a mask for the surface layer 254. In one embodiment, a liquid resist 256 is deposited on the surface layer 254 as a droplet that is subsequently distributed across the surface layer 254 by a stamper 104. In an alternative embodiment, the substrate 250 may be spun to distribute the liquid resist evenly across the top 258 of the substrate 250.

FIG. 3 illustrates a cross-sectional view of one embodiment of a stamper 300, a substrate 310, a vacuum chuck 320, a pressurized air source 330, and a vacuum source 332. The stamper 300 may include a patterned mold surface 302 for contacting a top 312 of the substrate 310. In one embodiment, the formed pattern of the stamper 300 may comprise nano-scaled features corresponding to data recording bits 212, and the substrate 310 may be similar to substrates 100 and 250 as illustrated in FIGS. 1A-2B. Alternatively, the stamper 300 may comprise any formed pattern, and the substrate 310 may be diversely configured.

The stamper 300 may be mechanically positioned to contact the substrate 310. Alternatively or in addition, the substrate 310 may be positioned to contact the mold surface 302. Those of skill in the art will recognize that the stamper 300 and the substrate 310 may be positioned relative to each other and/or to a designated contact surface. The invention is not, therefore, limited to the depicted embodiment nor to a horizontal arrangement. In one embodiment, the substrate 310 is positioned above the stamper 300 with the top 312 positioned to contact the mold surface 302. Alternatively, the stamper 300 and the substrate 310 may be positioned vertically.

In certain embodiments, the stamper 300 and/or the substrate 310 may be distanced or moved into contact with one or more mechanical devices. In one embodiment, a mechanical device (not shown) lifts the stamper 300 to a standby position 336 about one millimeter above the substrate 310 and holds the stamper 300 in place until the stamper 300 is required for imprinting. The stamper 300 may initially be separated from the substrate 310 with pressurized air. Subsequently, the mechanical device, such as a simple suspension fixture (not shown), may lift the stamper 300 from the substrate 310. Separating the stamper 300 from the substrate 310 prior to lifting the stamper 300 preserves the imprinted features.

In certain embodiments, the stamper 300 maybe transparent. Specifically, the stamper 300 may be transparent to ultra violet light in order to cure the imprintable resist. In one embodiment, the stamper 300 is comprised of polymethylmethacrylate (PMMA), a UV-transparent material. The stamper 300 and/or mold surface 302 may be made from quartz or silicon in certain embodiments. In one embodiment, the patterned mold surface 302 is formed using electron beam lithography. The formed pattern may be etched into the mold surface 302. In addition, the formed pattern may be a corresponding opposite of the desired substrate pattern. For example, holes in the stamper 300 correspond to pillars formed on the substrate 310.

Because the mold surface 302 may have a high density of nano-scaled features, the total surface area that contacts the substrate 310 may be effectively increased such that the stamper 300 has a strong tendency to stick to the substrate 310. To minimize the possibility of adhesion, the mold surface 302 and/or stamper 300 may be subjected to a release treatment to facilitate separation from the substrate 310. One example of a release treatment may include a chemical coating of a self-assembled monolayer, such as 1H, 1H, 2H, 2H-perflourodecyl-trichlorosilane (FDTS), which reduces the surface energy and has been demonstrated to decrease attraction forces. Other types of release treatments may be available to imbue the stamper 300 with a "non-sticky" quality.

The substrate 310 may comprise a plurality of layers as discussed in relation to FIG. 2B. Specifically, the substrate 310 may include an imprintable resist layer 256 for transferring the formed pattern of the stamper 300 to the substrate 310. In certain embodiments, the substrate 310 is transparent to UV light rays to facilitate curing the resist. In the depicted embodiment, the substrate 310 includes an opening 314, such as a central opening 204 (ID 208) in a disk 200, for example.

The substrate 310 may be supported or stabilized by a support mechanism. The support mechanism may comprise any mechanism that suitably retains the substrate 310 during the imprinting process. A clamp or the like may retain the substrate 100, though clamps may cause distortion in the substrate 310.

Vacuum chucks 320, which typically rely on suction force to retain the substrate 310, may eliminate the need for mechanical clamping components. In addition, the vacuum chuck 320 may provide a flat surface and an evenly distributed retaining force that reduce the likelihood of substrate distortion.

In the illustrated embodiment, the substrate 310 is held in place by a vacuum chuck 320 with an air channel 322 connected to the vacuum source 332, a surface support 324, an air channel 326 directed to the opening 314 in the substrate 310, and a substrate guide 328. In a contemplated embodiment, the vacuum chuck 320 secures the substrate 310 for imprinting, including during the separation process. The surface support 324 may be connected to the vacuum source 332 through the air channel 322. The surface support 324 may comprise a high density, porous metal, in certain embodiments, that retains its shape, yet enables air to pass through its pores. The surface support 324 supports and preserves the flatness of the substrate 310 when subjected to suction forces 334, thus preventing substrate distortion. The holding force 334 ($F_H$) retaining the substrate 310 maybe determined by the negative air pressure within the air channel 322.

FIG. 4 illustrates one embodiment of the stamper 300 in contact with the substrate 310. A chamber 400 is formed within the opening 314 of the substrate 310. The channel 326 may be coupled to a source 330 of pressurized air in order to direct pressurized air toward the chamber 400. The resist layer may be pressed between the substrate 310 and the stamper 300 to conform the resist to the formed pattern. A load and/or applied pressure may be applied to the stamper 300 and/or substrate 310 to facilitate molding the imprinted features.

The resist layer of the substrate 310 may be polymerized or solidified during the imprinting process. In certain embodiments, UV light rays 112 pass through the stamper 300 to cure the liquid resist, forming solid, patterned features on the substrate 310. As mentioned previously, heat may also be used to cure the resist to form solid topographical features in the substrate 310 depending on the nature of the imprinting process. The vacuum chuck 320, as depicted, may retain the substrate 310 during the curing process to prevent substrate movement. In a contemplated embodiment, the air pressure in the air channel 322 is sustained below the ambient air pressure to hold the substrate 310, while the air pressure in the channel 326 remains at the ambient air pressure during the imprinting and resist curing process.

In one embodiment, after the resist is cured, the load may be removed from the stamper 300 in order to prepare for the separation process. In certain embodiments, the resist curing process seals the chamber 400; however, as mentioned above, one or more release treatments or the like may facilitate the separation process. Consequently, the chamber 400 may or may not be airtight, although a certain external force is generally required to initiate stamper separation.

FIG. 5 illustrates one embodiment of the stamper 300 being separated from the substrate 310 with the force 500 of pressurized air. When the air pressure inside the chamber 400 exceeds the separation threshold, the stamper 300 separates quickly from the substrate 310, leaving the cured imprinted features intact. The pressurized air may be clean dry air (CDA) in certain embodiments. Alternatively, other gases or combination of gases may be pressurized to achieve similar results.

Within the chamber 400, the air exerts pressure on all sides, creating an uplifting force 500 that is sufficiently powerful to initiate a Mode 1 fracture surface displacement 502 separating the stamper 300 from the substrate 310. The forced air propagates the gap until separation is complete. In the case of a disk 200 substrate with a central opening 204, the Mode 1 fracture creates a gap starting from the ID 208 that propagates toward the OD 206, creating a simple but uniform separation, eliminating the need for addition force. Of course, one or more additional mechanical devices may be used in conjunction with the pressurized air, but are generally unnecessary.

The stamper 300 may subsequently be removed or lifted to the standby position 336 using a simple mechanical device. The air pressure within both air channels 322, 326 may be returned to ambient air pressure, and the substrate 310 may be removed from the vacuum chuck 320.

To successfully retain the substrate 310 during the separation process, the magnitude of the separation force 500 ($F_S$) may be limited by the substrate holding force 334 ($F_H$), wherein $F_S < F_H$. Otherwise, the applied separation force 500 ($F_S$) may overcome the holding force 334 and consequently displace the coupled stamper 300 and substrate 310 from the vacuum chuck 320, thereby causing the substrate separation process to fail; though sandwich lifting the stamper 300 and the substrate 310 together with pressurized air generally does not damage the formed surface structures.

In certain embodiments where the substrate 310 comprises a disk 200, the applied separation force 500 ($F_S$) may be determined by the following equation:

$$F_S = A_S * P_A = \pi * (D_S/2)^2 * P_A \qquad \text{Equation 1}$$

where $F_S$=the separation force required to separate the stamper from the substrate;
$A_S$=the stamper surface area in the chamber exposed to pressurized air;
$P_A$=applied air pressure; and
$D_S$=the diameter of the stamper surface in the chamber exposed to air.

In addition, the holding force 334 ($F_H$) for a disk 200 may be determined by the following equation:

$$F_H = A_H * P_V = \alpha * \pi * [(D_2/2)^2 - (D_1/2)^2] * P_V \qquad \text{Equation 2}$$

where $F_H$=the holding force required to retain the substrate;
$A_H$=the total area of the surface support holding the substrate;
$P_V$=negative pressure generated by vacuuming;
$\alpha$=the fraction of the surface support that provides a vacuum suction force;
$D_1$=the inside diameter of the surface support holding the substrate; and
$D_2$=the outside diameter of the surface support holding the substrate.

Beneficially, a vacuum chuck 320 may have a porous support surface 324 nearly as large as the entire substrate surface. In certain embodiments, the total area ($A_H$) of the surface support holding the substrate 310 may be determined by the fraction ($\alpha$) of the surface support that provides a vacuum suction force. For example, the value of $\alpha$ may represent the porosity ratio of the support surface 324 as compared to the overall surface area ($\pi * [(D_2/2)^2 - (D_1/2)^2]$). The vacuum pressure ($P_V$) may be determined by the vacuum pump capabilities, or the vacuum source 332, and generally may achieve a negative pressure as low as −0.8 atm (∼−12 psi).

Also of benefit, the area determining the separation force 500 ($F_S$) is limited to the exposed stamper surface area within the chamber 400 and not the opening 314 within the substrate 310. As a result, a strong force 500 ($F_S$) may be achieved independent of the size of the opening 314. In experimental observation, the applied air pressure ($P_A$) to achieve separation generally ranges up to about 80 psi, thus providing a wide range of options for controlling the separation process. In one embodiment, wherein the substrate 310 comprises a microdrive disk substrate having an OD 206 of about 1.1 inches, the stamper 300 may be separated from the substrate 310 with an applied air pressure ($P_A$) of less than about 10 psi.

The schematic flow chart diagram that follows is generally set forth as a logical flow chart diagram. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Additionally, the order in which a particular method occurs may or may not strictly adhere to the order of the corresponding steps shown.

Figure 6:
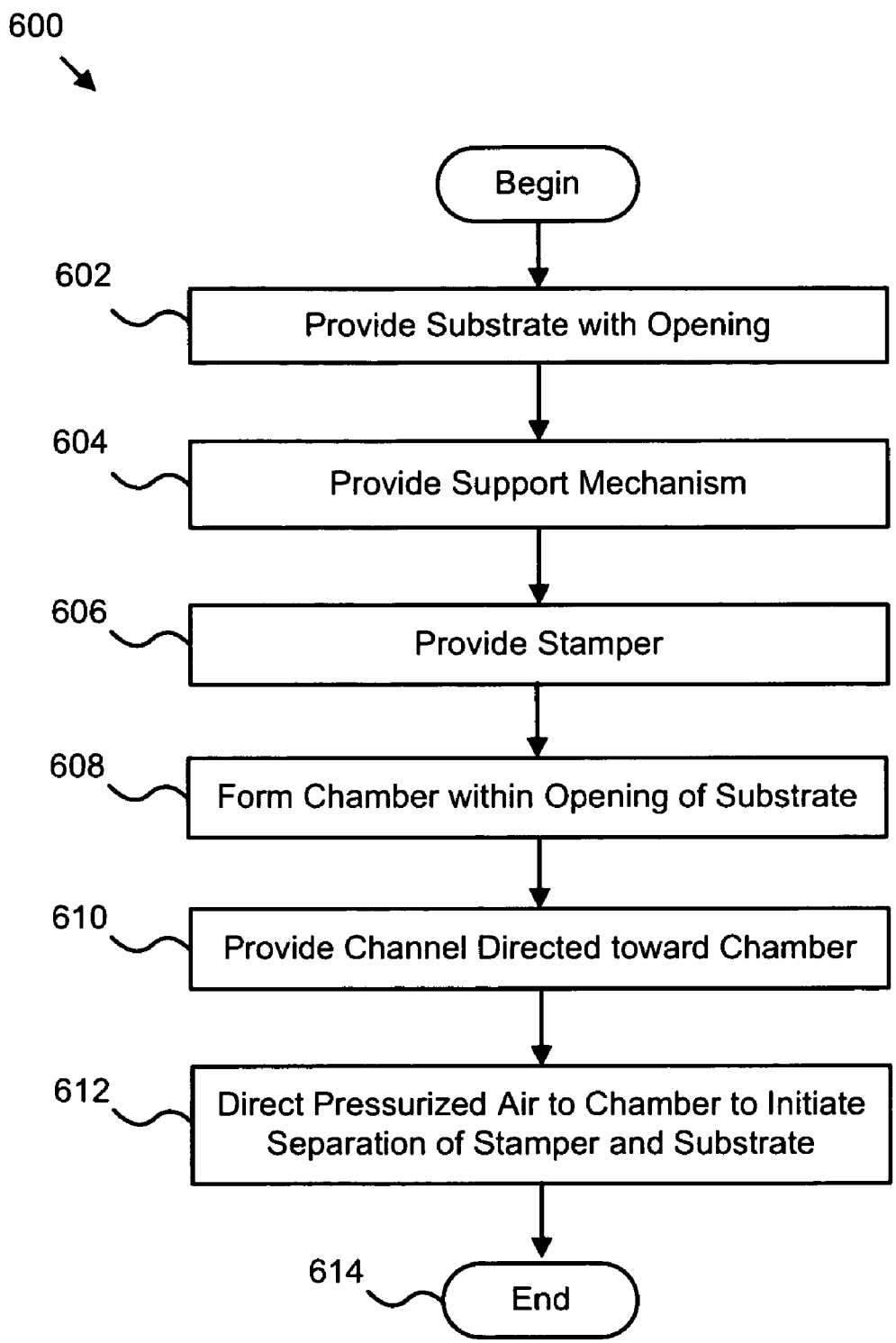
FIG. 6 is a schematic flow chart diagram illustrating one embodiment of a stamper separation method in accordance with the present invention.

FIG. 6 illustrates one embodiment of a method 600 for separating a stamper from a substrate in accordance with the present invention. The method 600, as illustrated, includes providing 602 a substrate with an opening, providing 604 a support mechanism for retaining the substrate, providing 606 a stamper with a formed pattern, forming 608 a chamber within the opening of the substrate when the stamper is in contact with the substrate, providing 610 a channel directed toward the chamber, and directing 612 pressurized air through the channel.

The pressurized air facilitates decoupling the stamper from the substrate without endangering the stamper, the substrate, or any surface features. In addition, a uniform, uplifting force may be provided to separate the stamper without the use of complicated mechanical devices. So long as the pressure increase in the chamber sufficiently allows for separation between the stamper and the substrate, the method 600 functions independently of the condition of the formed chamber, for example, whether the chamber is airtight or the chamber size.

The method 600 provides a simple and inexpensive manufacturing process to create an imprinted substrate, particularly with regard to disk substrates. In the magnetic storage industry, magnetic recording disks 200 generally comprise a central ID hole that may be utilized to facilitate in situ separation of the stamper. Using pressurized air to initiate separation of the stamper is easy to execute and reduces imprinting tooling costs.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for separating a stamper from a patterned substrate, the method comprising:
    providing a substrate having a top and a bottom with an opening therein, the top comprising an imprintable resist layer;
    providing a support mechanism configured to retain the substrate with a suction force;
    providing a stamper having a formed pattern and configured to come in contact with the top of the substrate to transfer the formed pattern to the imprintable resist layer, wherein a chamber is formed within the opening of the substrate when the stamper is in contact with the top of the substrate, and wherein the formed pattern comprising nano-scaled features each comprising a width of at most approximately 20 nanometers;
    providing a channel directed toward the chamber to introduce pressurized air into the chamber;
    applying a suction force to the substrate to prevent movement of the substrate relative to the support mechanism; and
    while applying the suction force to the substrate, directing pressurized air through the channel to the chamber to initiate separation of the stamper from the substrate.

2. The method of claim 1, wherein the method further comprises curing the imprintable resist layer to achieve solidification prior to directing pressurized air through the channel.

3. The method of claim 1, wherein the method further comprises distancing the substrate and the stamper with a mechanical device subsequent to the initial separation.

4. The method of claim 1, wherein the method further comprises treating the stamper with a release treatment to facilitate separation from the substrate.

5. The method of claim 1, wherein the nano-scaled features correspond to data recording bits.

6. The method of claim 1, wherein the imprintable resist layer is self-releasing.

7. The method of claim 1, wherein the substrate further comprises a surface layer selected to undergo a feature etching process.

8. The method of claim 7, wherein the substrate further comprises an adhesion promoter to increase stickiness between the surface layer and the imprintable resist layer.

9. The method of claim 7, wherein the method further comprises conducting the feature etching process.

10. The method of claim 9, wherein the method further comprises coating the substrate with a magnetic layer subsequent to the feature etching process to form patterned magnetic media.

11. The method of claim 10, wherein the substrate is a disk comprising an inside diameter and an outside diameter and wherein the method further comprises incorporating the substrate within a storage device as patterned magnetic media.

12. The method of claim 1, wherein the support mechanism comprises a surface support coupled to a vacuum source, the surface support comprising a high density, porous metal, and wherein the vacuum is operable to apply the suction force to the substrate to retain the substrate against the surface support.

13. The method of claim 12, wherein the surface support is nearly as large as a top or bottom surface the substrate.

14. A method for separating a stamper from a patterned substrate, the method comprising:
    providing a substrate having a top and a bottom with an opening therein, the top comprising an imprintable resist layer;
    providing a vacuum chuck configured to retain the substrate with a suction force;
    providing a stamper having a formed pattern, the formed pattern comprising nano-scaled features each comprising a width of at most approximately 20 nanometers, and the stamper configured to come in contact with the top of the substrate to transfer the formed pattern to the imprintable resist layer, wherein a sealed chamber is formed within the opening of the substrate when the stamper is in contact with the top of the substrate;
    providing a channel through the vacuum chuck directed toward the sealed chamber to introduce pressurized air into the sealed chamber;
    applying a suction force to the substrate to prevent movement of the substrate relative to the vacuum chuck; and
    while applying the suction force to the substrate, directing pressurized air through the channel to the sealed chamber to initiate separation of the stamper from the substrate.

15. The method of claim 14, wherein the nano-scaled features correspond to data recording bits.

16. The method of claim 15, wherein the substrate further comprises a surface layer selected to undergo a feature etching process.

17. The method of claim 16, wherein the substrate is a disk comprising an inside diameter and an outside diameter and wherein the method further comprises incorporating the substrate within a storage device as patterned magnetic media.

18. A method for separating a stamper from a patterned substrate, the method comprising:
    providing a substrate having a top and a bottom with an opening therein, the top comprising an imprintable resist layer, a surface layer selected to undergo a feature etching process, and an adhesion promoter to enhance stickiness between the surface layer and the imprintable resist layer;
    providing a vacuum chuck configured to retain the substrate with a suction force;
    providing a stamper having a formed pattern and the stamper configured to come in contact with the top of the substrate to transfer the formed pattern to the imprintable resist layer, wherein a sealed chamber is formed within the opening of the substrate when the stamper is in contact with the top of the substrate, and wherein the formed pattern comprises nano-scaled features corresponding to data recording bits, each of the nano-scaled features comprising a width of at most approximately 20 nanometers;
    treating the stamper with a release treatment to facilitate separation from the substrate;

providing a channel through the vacuum chuck directed toward the sealed chamber to introduce pressurized air into the sealed chamber;

retaining the substrate with the suction force; and while retaining the substrate with the suction force, directing pressured air through the channel to the sealed chamber to initiate separation of the stamper from the substrate, wherein the suction force is greater than the force exerted by the pressurized air, the pressurized air having a pressure that provides the separation force required to form a Mode 1 fracture displacement between the stamper and the substrate, the Mode 1 fracture initiated without mechanical mechanisms.

19. An apparatus for separating a stamper from a patterned substrate, the apparatus comprising:

a substrate having a top and a bottom with an opening therein, the top comprising an imprintable resist layer;

a support mechanism configured to retain the substrate with a suction force;

a stamper having a formed pattern, the formed pattern comprising nano scaled features, and the stamper configured to come in contact with the top of the substrate to transfer the formed pattern to the imprintable resist layer, wherein a chamber is formed within the opening of the substrate when the stamper is in contact with the top of the substrate, and wherein the formed pattern comprises nano-scaled features comprising a width of at most approximately 20 nanometers;

a channel directed toward the chamber to introduce pressurized air into the chamber; and a source of pressured air directed through the channel to the chamber to initiate separation of the stamper from the substrate; and wherein the source of pressurized air is directed through the channel to the chamber while the support mechanism retains the substrate with the suction force.

20. The apparatus of claim 19, wherein the support mechanism comprises a vacuum chuck configured to retain the substrate with suction force and wherein the suction force is greater than the force exerted by the pressurized air.

21. The apparatus of claim 20, wherein the channel is directed toward the sealed chamber through the vacuum chuck.

22. The apparatus of claim 19, wherein the stamper comprises a release treatment to facilitate separation from the substrate.

23. The apparatus of claim 19, wherein the imprintable resist layer is polymerized before separation from the stamper.

24. The apparatus of claim 19, wherein the substrate is a disk comprising an inside diameter and an outside diameter and is configured to be incorporated within a storage device as patterned magnetic media.

* * * * *

UNITED STATES PATENT AND TRADEMARK OFFICE
CERTIFICATE OF CORRECTION

PATENT NO. : 7,695,667 B2  Page 1 of 1
APPLICATION NO. : 11/365021
DATED : April 13, 2010
INVENTOR(S) : Margaret Evans Best et al.

It is certified that error appears in the above-identified patent and that said Letters Patent is hereby corrected as shown below:

Title Page 1, ABSTRACT, line 10
"directing pressured air"—should read "directing pressurized air"

Title Page 1, ABSTRACT, line 15-16
"pattered magnetic media"—should read "patterned magnetic media"

Column 3, Line 41
"directing pressured air"—should read "directing pressurized air"

Column 12, Line 33-34
"directing pressured air"—should read "directing pressurized air"

Column 13, Line 5-6
"directing pressured air"—should read "directing pressurized air"

Column 14, Line 3
"source of pressured air"—should read "source of pressurized air"

Signed and Sealed this

Twenty-second Day of June, 2010

David J. Kappos
*Director of the United States Patent and Trademark Office*